United States Patent [19]

Stodola

[11] 4,035,663
[45] July 12, 1977

[54] TWO PHASE CLOCK SYNCHRONIZING METHOD AND APPARATUS

[75] Inventor: Kevin C. Stodola, Plano, Tex.

[73] Assignee: Rockwell International Corporation, El Segundo, Calif.

[21] Appl. No.: 719,486

[22] Filed: Sept. 1, 1976

[51] Int. Cl.² .................. H03K 19/08; H03K 1/17; H03K 5/13
[52] U.S. Cl. .............................. 307/208; 307/269; 328/63
[58] Field of Search ............ 307/208, 269; 328/63; 178/69.5 R

[56] References Cited
U.S. PATENT DOCUMENTS

| 3,812,388 | 5/1974 | Southworth | 307/208 |
| 3,862,440 | 1/1975 | Suzuki et al. | 307/269 |
| 3,916,223 | 10/1975 | Fette et al. | 307/208 |
| 3,947,697 | 3/1976 | Archer et al. | 307/208 |
| 3,953,744 | 4/1976 | Kawagoe | 307/208 |

Primary Examiner—Stanley D. Miller, Jr.
Attorney, Agent, or Firm—Bruce C. Lutz; Robert J. Crawford

[57] ABSTRACT

A circuit for detecting and synchronizing an incoming signal to a reference clock wherein the incoming signal has a slightly lower frequency and may be variable in frequency with respect to the reference clock frequency. The output from this synchronizer will be stable during the first half-cycle of the reference clock and may vary during the second half-cycle of the reference clock.

3 Claims, 2 Drawing Figures

TWO PHASE CLOCK SYNCHRONIZING METHOD AND APPARATUS

THE INVENTION

The present invention is directed generally to electronics and more specifically to a synchronizing device for converting a nonsynchronized clock signal of variable duration to a synchronized signal having a substantially constant duration.

The synchronizing results of the present circuit have been obtained in the prior art by using a clock frequency which is approximately double, or greater than double, the frequency of the signal being detected. However, there are instances, when the frequencies involved are so high that it is not practical to double this frequency to obtain a clock or when a clock signal near the frequency of the signal being detected is already available and it's not economical to generate a new clock, that it is very advantageous to use the present circuit. As implied, the present invention is to be used when the signal being detected may be more or less than a reference clock period in length but does have the restraints of the signal being detected remaining in a detectable condition, either logic 1 or logic 0, whenever entered, for more than a half-cycle or the reference clock period and having a frequency of less than the reference clock frequency. The output obtained from this circuit will be stable during the first half-cycle of the reference clock and may change during the second half-cycle of the reference clock. Furthermore, the output will be a logic 1 during the first half-cycle of the reference clock only once for each input signal change from logic 0 to logic 1, regardless of the length of the input signal being detected.

It should be noted during the discussions that the signals shown in the waveform diagrams are idealized as square waves. In actuality, the corners of these signals are badly rounded and distorted in the real world and thus the circuit uses a logic level latch in a regenerative type fashion to determine if a signal is a logic "1" or logic "0" at the end of a reference clock half-cycle and the logic processing is obtained from that determination.

It is therefore an object of the present invention to provide an improved clock synchronizing circuit.

Other objects and advantages of the present invention may be ascertained from a reading of the specification and appended claims in conjunction with the drawings wherein:

Figure 1:
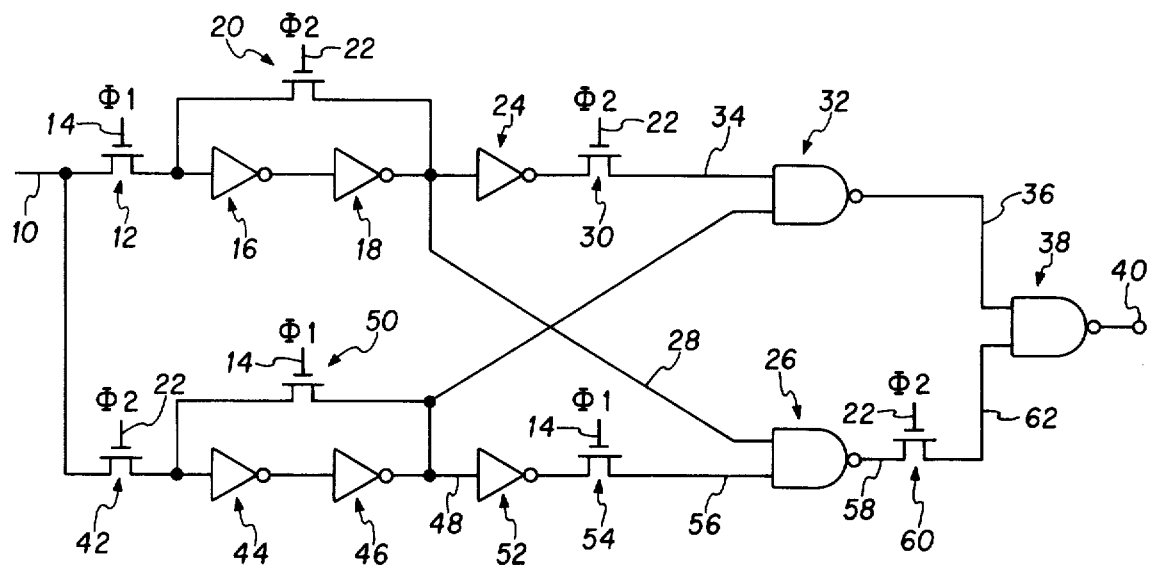
FIG. 1 is a schematic diagram of one embodiment of the invention.

With reference being made to FIG. 1, the following description of operation will be provided. The phase 1 clock ($\phi 1$) provided to the various FET's will turn ON the appropriate gates when a logic 0 is provided. The phase 2 clock is the inverse of the phase 1 clock and will operate on the transistor switches in the same manner.

In FIG. 1, an input 10 feeds signals through a first FET switch generally designated as 12 having a clock or control input 14. Signals fed through switch 12 are supplied to the input of an inverter 16 and from there through an inverter 18 so that the signal at the output of inverter 18 is substantially identical to that supplied to the input of inverter 16. In parallel with the two inverters in a switch 20 having a phase 2 input 22. The output of inverter 18 is fed both to a further inverter 24 and to the input of a NAND gate 26 on a lead 28. An output of inverter 24 is supplied through a further switch 30 having a control input 22 to an input of a NAND gate 32 on a lead 34. An output of NAND gate 32 is supplied on a lead 36 to a NAND gate 38 having its output connected to an apparatus output 40. Input 10 is also connected through a switch 42 having a control input 22 to an inverter 44. After passing through inverter 44, the signal is passed through an inverter 46 to a lead 48. A switch 50 is connected in parallel with inverters 44 and 46 in a manner similar to that of 20. Switch 50 has a control input 14. The lead 48 is connected to an input of an inverter 52 and is also connected to a second input of NAND gate 32. An output of inverter 52 is supplied through a switch generally designated as 54 to a further input of NAND gate 26. The switch 54 has a control input 14. An output 58 of NAND gate 26 is supplied through a switch 60 to a lead 62 supplying signals to a further input of NAND gate 38. Switch 60 has a control lead 22.

The control leads of switches 12, 50 and 54 have the same designation since each of these is connected to an identical signal source. The switches 20, 30, 42 and 60 each have a control lead designated as 22 for the same reason.

Figure 2:
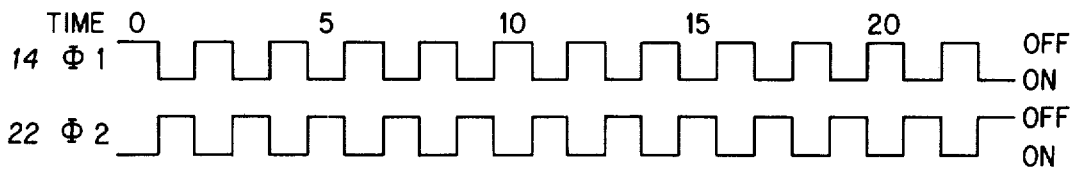
FIG. 2 is a compilation of waveforms utilized in explaining the circuit diagram of FIG. 1.
Figure 2:
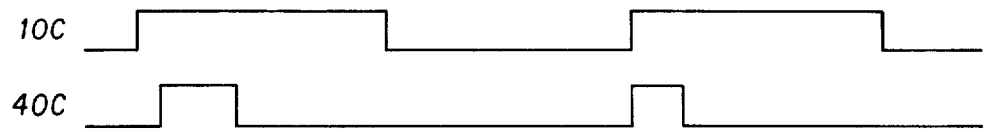

As illustrated in FIG. 2, one waveform is labeled as 14 and another waveform is labeled 22 as an illustration of the waveforms provided to the appropriate switches. The waveforms 10A, 10B and 10C represent different types of input signals all using the same clocks 12 and 22 while the waveforms 40A, 40B and 40C represent the respective outputs obtained from the given inputs, A, B and C.

As will be noted from the outputs waveforms, the output pulse is sometimes less than a full clock time period. This occurs because the input signal is checked for a transition from logic 0 to logic 1 during the $\phi 1$ (phase 1) logic 0 condition, but the output which is caused by this event is delayed until the transition from the $\phi 2$ logic 1 to the $\phi 2$ logic 0 condition. If the incoming signal changes from logic 0 to logic 1 at any time during the $\phi 2$ logic 0 condition, an output is obtained immediately. Thus, the output can change to a logic 1 any time from the beginning of the $\phi 2$ logic 0 condition to just prior to the end of the $\phi 2$ logic 0 condition but will never change during a $\phi 1$ logic 0 condition.

THE OPERATION

It may be assumed that the conditions found during the first logic 1 waveform (10A) of FIG. 2 are incurred by the synchronizer of FIG. 1. Thus, while control or switch signal 14 is in a logic 0 condition during time period 1, the input logic 1 signal, occurring half-way through time period 1, is supplied through switch 12 to the input of inverter 16 where it is inverted and supplied to the input of inverter 18 where it is again inverted. Thus, the outut on lead 28 is a logic 1 at the time that control signal 14 returns to a logic 1 (time period 2) and control 22 switches to a logic 0. At this point time, switch 20 is actuated to regenerate the logic 1 signal on lead 28. This logic 1 signal is supplied to one input of NAND gate 26 and also to the input of inverter 24 where it is inverted and passed through gate 30 as logic 0 to one input of NAND gate 32. Since, as will be noted from FIG. 2 waveform 10A, the input on 10 was logic 0 during the previous transition from $\phi 2$ logic 0 to φ2 logic 1, there would be a logic 0 on the lead 48 and this would have been supplied to one input of NAND gate 32 and also to inverter 52 where it would have been inverted such that a logic 1 was passed through gate 54 and input to NAND gate 26. With two logic 1 inputs to NAND gate 26, a logic 0 will be passed through gate 56 and supplied to one input of NAND gate 38 such that a logic 1 is provided at apparatus output 40. As is standard, a NAND gate in the present discussion provides a logic 0 output only with two logic 1 inputs.

Using the above line of reasoning for the type of input shown in waveform 10A, it will be noted that although the first input pulse at time period 1 would produce a logic 1 on the output only during time period 2 and 3, a second input pulse has occurred during time period 3 which will produce a logic 1 on the output during the time period 4 and 5. This same type of condition occurs again at the beginning of time period 6, resulting in an output, as shown in waveform 40A, which remains at a logic 1 for three full reference clock cycles (6 time periods). Since it is a condition of operation that the signal being detected have a duration at least as long as a time period of the clock, (the frequency of the clock is higher than the signal being detected) eventually there will be an interruption in the output as illustrated in waveform 40A at time period 7 and the output will return to a logic 0 temporarily. It will be noted that the output waveform 40A will be a logic 1 during φ1 logic 0 only once for each change of input waveform 10A from logic 0 to logic 1, and that the output logic 1, during φ1 logic 0, always occur following the start of the first φ1 logic 0 condition following the input signal change from logic 0 to logic 1.

If the input signal has a cycle twice as long or much longer than the clock cycle as illustrated in waveforms 10B or 10C, the output signal will still only be a maximum of one clock cycle. As will be noted, however, the outputs signal will always be stable during the φ1 logic 0 condition and will be a logic 1 during φ1 logic 0 only once for each input signal transition from logic 0 to logic 1.

While as explained above, the signals in the real world are never as true to form as the idealized representations of FIG. 2, they do vary between some recognizable logic 0 and logic 1 levels. Thus, the inverters 16 and 18, in combination with switch 20 provide the function of a logic level latch and the inverters 44 and 46 in combination with the switch 50 provide a similar function. In operation of the circuit, a regenerative action occurs at the time of transition of the reference clock signals 14 and 22 and these latching circuits maintain whichever logic level is provided at the input thereof for the next entire half-cycle of the reference clock.

In this embodiment of the invention, the first half-cycle of the reference clock is defined as the time when φ2 is a logic 0 and φ1 is a logic 1 and the opposite logic conditions define the second half-cycle. In view of the above explanation, it will be realized that the logic level of the incoming signal as supplied at the end of a second half cycle of the reference clock will be stored on lead 48 for the following first half-cycle of the reference clock as a first signal. At the end of this following half-cycle of the reference clock, the logic level of the incoming signal will be stored on lead 28 as a second signal, and the first signal will be stored by means of gate 54, in its inverted condition, as a third signal on lead 56. Both the second and the third signals will be stored for the following second half-cycle of the reference clock. At the end of this following second half-cycle of the reference clock, the second signal will be stored by means of gate 30, in its inverted condition, as a fourth signal on lead 34. The second and third signals are NANDed in NAND gate 26 to provide, on lead 58, a fifth signal which is stored by means of gate 60 as a sixth signal on lead 62. Both the fourth and the sixth signals will be stored for the second following first half-cycle of the reference clock. NAND gate 32 combines the first and fourth signals to provide a seventh signal on lead 36. Since both the first and fourth signals are being stored for the second following first half-cycle of the reference clock then the seventh signal will also be stable during this first half-cycle of the reference clock. NAND gate 38 combines the sixth and seventh signals to provide the synchronized output signal on lead 40 which is representative of the train of pulses on the incoming signal on lead 10. Since the seventh signal is stable during the second following first half-cycle of the reference clock, and the sixth signal is being stored for this same first half-cycle, then the output signal on lead 40 will also be stable during the first half-cycle of the reference clock.

While a single embodiment of the present inventive concept has been illustrated, it will be realized by those skilled in the art that other specific circuits can be used to practice the present inventive concept. I therefore wish to be limited only by the scope of the appended claims.

What is claimed is:
1. The method of synchronizing an incoming signal comprising a train of pulses to a reference clock comprising the steps of:
    storing a signal indicative of the logic level of said incoming signal at the end of a second half-cycle of a reference clock as a first signal;
    storing a signal indicative of the logic level of said incoming signal occurring during a following first half-cycle of said reference clock as a second signal;
    storing a signal indicative of the logic level of said incoming signal at the end of the last previous second half-cycle of said reference clock as a third signal;
    storing a signal indicative of the logic level of said incoming signal at the end of the last previous first half-cycle of said reference clock as a fourth signal;
    NANDing said second and third signals to provide a fifth signal;
    passing said fifth signal as a sixth signal during each first half-cycle of said reference clock;
    storing said sixth signal during the following second half-cycle of said reference clock;
    NANDing said first and fourth signals to provide a seventh signal; and
    NANDing said sixth and seventh signals to provide a synchronized output signal representative of the incoming train of pulses.
2. Apparatus for synchronizing an incoming signal to a reference clock comprising, in combination:
    means for supplying an incoming signal comprising a train of pulses;
    means for supplying a reference clock signal having full cycles each comprising first and second half-cycles;

means for storing a signal indicative of the logic level of said incoming signal at the end of a second half-cycle of the reference clock as a first signal;

means for connecting the first two recited means to supply signals to the third recited means;

means for outputting a signal indicative of the logic level of said incoming signal occurring during a first half-cycle of said reference clock as a second signal;

means for connecting the first two recited means to said means for outputting;

first storage means, connected to said means for storing, for storing a signal indicative of the logic level of said incoming signal at the end of the last previous second half-cycle of said reference clock as a third signal;

second storage means, connected to said means for outputting, for storing a signal indicative of the logic level of said incoming signal at the end of the last previous first half-cycle of said reference clock as a fourth signal;

first NAND gate means, connected to said means for outputting and to said first storage means, for receiving said second and third signals therefrom to provide a fifth signal;

gating means connected to the output of said first NAND gate means, for passing said fifth signal during each second half-cycle of said reference clock and for storing said fifth signal during the following first half-cycle of said reference clock as a sixth signal;

second NAND gate means, connected to said means for storing and to said second means, for receiving said first and fourth signals therefrom to provide a seventh signal; and third NAND gate means connected to said second NAND gate means and to said gating means for receiving said sixth and seventh signals therefrom to provide a synchronized output signal representative of the incoming train of pulses.

3. Apparatus for providing a synchronized output pulse train of a given frequency from a lower frequency incoming unsynchronized train of pulses comprising, in combination:

first means for supplying a reference clock signal having full cycles each comprising first and second half-cycles;

means for supplying an incoming signal comprising a train of pulses to be synchronized;

first detection means for commencing an output whenever, between the end of the first half cycle and the end of the second half-cycle, the logic level of said incoming signal changes with respect to its logic level at the end of the previous second half-cycle;

logic circuit means for continuing the output to the end of the first half-cycle following the commencement of said output;

second detection means for commencing an output at the beginning of a second half-cycle whenever, between the end of the previous second half-cycle and the end of a present first half-cycle, the logic level of said incoming signal changes with respect to its logic level in the previous second half-cycle; and logic circuit means for continuing the output for a full cycle following the commencement of said output as generated by said second detection means.

* * * * *